United States Patent [19]

Neal et al.

[11] Patent Number: 4,544,853
[45] Date of Patent: Oct. 1, 1985

[54] INTEGRATED COMPARATOR CIRCUIT

[75] Inventors: Mathew Neal, Freiburg; Jochen Reimers, Gundelfingen, both of Fed. Rep. of Germany

[73] Assignee: ITT Industries, Inc., New York, N.Y.

[21] Appl. No.: 455,447

[22] Filed: Jan. 4, 1983

[30] Foreign Application Priority Data

Feb. 6, 1982 [EP] European Pat. Off. ......... 82100870.3

[51] Int. Cl.[4] .............................................. H03K 5/24
[52] U.S. Cl. ..................................... 307/530; 307/355
[58] Field of Search ................ 307/350, 530, 355, 279

[56] References Cited

U.S. PATENT DOCUMENTS 4,375,039 2/1983 Yamauchi ........................... 307/530

Primary Examiner—John Zazworsky
Attorney, Agent, or Firm—Donald J. Lenkszus

[57] ABSTRACT

Between the source of operating voltage (U) and the zero point of the circuit there are provided four series arrangements (s1 ... s4) of the controlled current paths of each time three insulated-gate field-effect transistors of the same conductivity type, of which the upper transistors (o1 ... o4) as connected to the source of operating voltage, and the center transistors (m1 ... m4) are of the depletion type and of identical geometry, while the lower transistors (u1 ... u4) as connected to the zero point of the circuit, are of the enhancement type and likewise of identical geometry. The center transistors (m1, m3, m4) are connected as a resistors while the gate of the center transistor (m2) is connected to the point connecting the upper and the center transistor (o4, m4). The first input (e1) is connected to the gates of the upper transistors (o1, o3) and the second input (e2) to the gates of the upper transistors (o2, o4). The output of the inverter as formed by the series arrangements (s1 .. . s4) is the point connecting the respective lower and center transistors. The gates of the lower transistors (u2 ... u4) are each connected to the output of the directly preceding inverter, while the gate of the lower transistor (u1) is connected to the output of its inverter, with the output of the fourth inverter being the output (a) of the comparator circuit.

4 Claims, 1 Drawing Figure

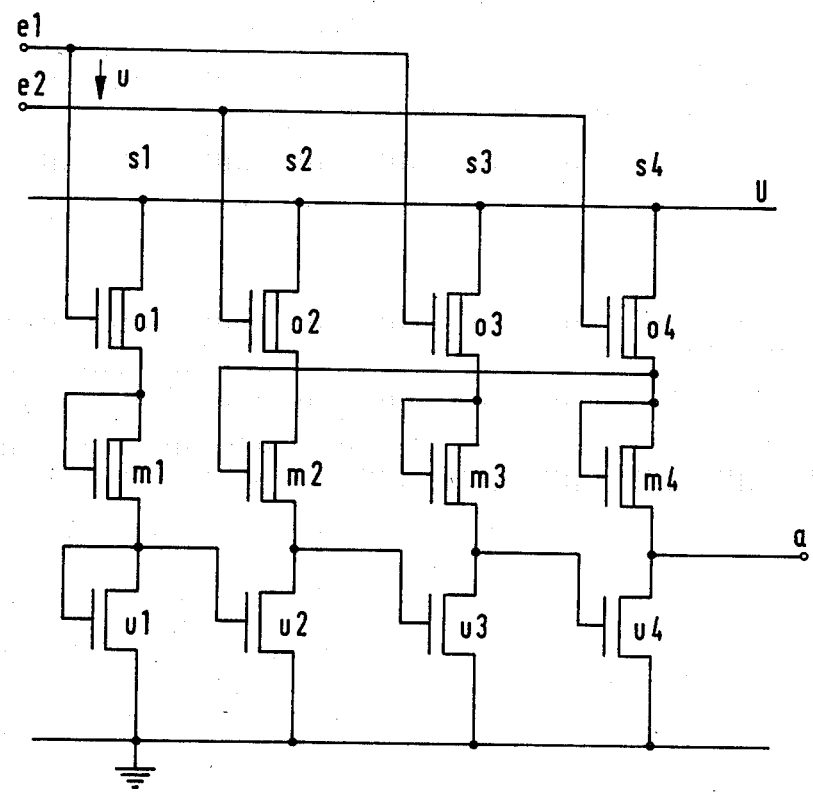

INTEGRATED COMPARATOR CIRCUIT

BACKGROUND OF THE INVENTION

The invention pertains to an integrated comparator circuit employing insulated-gate field-effect transistors of the same conductivity type. More specifically, the invention pertains to a comparator circuit which in response to an arbitrary potential difference at two inputs generates an output signal with either a low-level state possibly corresponding to the potential of the zero point of the circuit, or a high-level state possibly corresponding to the potential of the source of operating voltage.

Such comparator circuits can be used, for example, as sense amplifiers for memories employing static memory cells operating e.g., on the flip-flop principle. The potential difference occurring at the two outputs of such memory cells is equal to the voltage difference between the high-level state at the one output and the low-level state at the other output, and vice versa. This difference is to be "read" or in such a way that the maximum difference between the high-level state and the low-level state will occur at this output, i.e., that the two states are each as close as possible to the potential of either the zero point of the circuit or that of the operating voltage. Moreover, the circuit is required to respond safely to small potential differences at the input, i.e., the sensitivity of the circuit within the area of the potential difference zero at the input is supposed to be as great as possible, thus noticeably increasing the response rate.

It is desireable for such a comparator circuit to have a low current consumption. It is further desireable that a comparator circuit used as part of an overall integrated circuit, for example, as part of a memory matrix, be as insensitive as possible with respect to manufacturing process parameter fluctuations. It is also desireable that an integrated comparator circuit use little surface area.

SUMMARY OF THE INVENTION

In accordance with the principle of the invention, an improved comparator circuit is provided. The circuit includes four circuit branches connected between the voltage source and the zero point of the circuit. Each branch includes three insulated-gate field effect transistors having their controlled current paths connected in series. The upper transistors, i.e., those connected directly to the voltage source, as well as the middle transistors are of the depletion type. The lower transistors, i.e., those connected directly to the zero point, are of the enhancement type. The gates of the upper transistors of the first and third circuit branches are connected to the first comparator input and the gates of the upper transistors of the second and fourth branches are connected to the second comparator input. The middle transistors of the first, third and fourth branches are connected as resistors. The gate of the middle transistor of the second branch is connected to the junction between the upper and middle transistors of the fourth branch to provide feedback. The junction between the middle transistor and the lower transistor in each circuit branch is used as an output with the output of each branch being coupled to the gate of the lower transistor of the succeeding stage. The output of the fourth stage serves as the comparator output.

BRIEF DESCRIPTION OF THE DRAWING

The invention will be better understood from a reading of the following detailed description in conjunction with the sole drawing figure which is a circuit diagram of one embodiment of the invention.

DETAILED DESCRIPTION

Between the source of operating voltage U and the zero point of the circuit there are provided four circuit branches s1, s2, s3, s4. Each branch includes the serially connected controlled current paths of three transistors. One transistor in each branch, i.e., transistors o1, o2, o3, o4 is connected to the voltage source. Upper transistors s1, s2, s3, s4 and the center transistors m1, m2, m3, m4 are of the depletion type. Upper transistors o1, o2, o3, o4 are of the same geometrical dimensions. Likewise, middle transistors m1, m2, m3, m4 are of the same geometrical dimensions. Each of the lower transistors u1, u2, u3, u4 is connected to the zero point of the circuit and lower transistors u1, u2, u3, u4 are identical with respect to their geometrical dimensions, and are of the enhancement type.

The input of each circuit branch is the gate of the respective upper transistor o1, o2, o3 or o4, and the output thereof is the respective point connecting the center transistors m1, m2, m3 or m4 and the lower transistors u1, u2, u3 or u4. The inputs of the first and of the third circuit branches s1, s3 are jointly connected to the first input e1 of the comparator circuit, and the inputs of the second and fourth series arrangement s2, s4 are connected to the second input e2.

The center transistors m1, m3, m4 of the first, third and fourth circuit branches s1, s3, s4 are connected as resistors in that their gates are connected to the points connecting the associated upper transistors. The gate of the center transistor m2 of the second series arrangement s2 is connected to the point connecting the upper and the center transistor o4, m4 of the fourth series arrangement s4, thus providing feedback within the comparator circuit.

The gate of lower transistor u1 of the first circuit branch s1 is connected to the output thereof to which there is also connected the gate of the lower transistor u2 of the second series arrangement s2. The gate of the lower transistor u3 of the third circuit branch s3 is connected to the output of the second circuit branch s2. The gate of lower transistor u4 of the fourth circuit branch s4 is connected to the output of the third circuit branch s3. The output of the fourth series arrangement s4 is the output a of the comparator circuit.

During operation, the upper transistor o1, o2, o3, o4 act as voltage-controlled resistors. The first circuit branch s1 together with the second circuit brand s2 forms a current mirror circuit with respect to the corresponding current in the series arrangement, with the current being determined by the potential at the input e1.

Within the area of the potential difference zero at the two inputs e1, e2, the outputs of the four circuit branches each assume the same potential, so that the inverters respectively formed by the four series arrangements s1 . . . s4 show to have their greatest mutual conductance.

Assume now that the potential difference u in the direction from the first to the second input e1, e2 deviates in the positive sense from zero. In that case the upper transistors o1, o3 become more low ohmic and the upper transistors o2, o4 become more high ohmic, so that the current flowing in the lower transistors u1, u2 is increased. Accordingly, the output voltage of both the second and the fourth series arrangement s2, s4 decreases, and that of the third series arrangement s3 increases. At the same time, the voltage at the gate of the center transistor m2 drops off, with this assisting the dropping of the output voltage of the second series arrangement s2. From this there results a raped switching of the arrangement, so that the comparator circuit in addition to its good responsiveness, also has a very good response rate.

A comparator circuit according to the invention was used with a static memory of the random access type which was operated at a clock frequency of 17 MHz. The comparator circuit was capable of "reading" (sensing) the memory status changes which were effected at this frequency.

We claim:

1. An integrated comparator circuit comprising a plurality of insulated-gate field effect transistors of the same conductivity type, said circuit being responsive to the potential difference between first and second input terminals to provide an output signal at an output terminal, said circuit comprising:
    a first circuit branch comprising first, second and third transistors having their controlled current paths serially connected between a voltage source and a zero point for said current;
    a second circuit branch comprising fourth, fifth and sixth transistors having their controlled current paths serially connected between said voltage source and said zero point;
    a third circuit branch comprising seventh, eighth and ninth transistors having their controlled current paths serially connected between said voltage source and said zero point;
    a fourth circuit branch comprising tenth, eleventh and twelfth transistors having their controlled current paths serially connected between said voltage source and said zero point;
    the gate of said first transistor and the gate of said seventh transistor both being connected to said first input terminal;
    the gate of said fourth transistor and the gate of said tenth transistor both being connected to said second input terminal;
    the gate of said second transistor being coupled to the junction between said first and second transistors; the gate of said eighth transistor being connected to the junction between said seventh and eighth transistors;
    the gates of said fifth and eleventh transistors both being connected to the junction between said tenth and eleventh transistors;
    the gates of said third and said sixth transistors being coupled to the junction between said second and third transistors;
    the gate of said ninth transistor being connected to the junction between said fifth and sixth transistors;
    the gate of said twelfth transistor being connected to the junction between said eighth and ninth transistors; said output terminal connected to the junction of said eleventh and twelfth transistors.

2. A circuit in accordance with claim 1 wherein:
    said first, fourth, seventh and tenth transistors are of the depletion type;
    said second, fifth, eighth and eleventh transistors are of the depletion type; and
    said third, sixth, ninth and twelfth transistors are of the enhancement type.

3. A circuit in accordance with claim 1 wherein:
    said first, fourth, seventh and tenth transistors are of identical geometrical dimensions;
    said second, fifth, eighth and eleventh transistors are of idential geometrical dimensions; and
    said third, sixth, ninth and twelfth transistors are of identical geometrical dimensions.

4. A circuit in accordance with claim 2 wherein:
    said first, fourth, seventh and tenth transistors are of identical geometrical dimensions;
    said second, fifth, eighth and eleventh transistors are of identical geometrical dimensions; and
    said third, sixth, ninth and twelfth transistors are of identical geometrical dimensions.

* * * * *